US009361962B2

(12) United States Patent
Kucsko et al.

(10) Patent No.: US 9,361,962 B2
(45) Date of Patent: Jun. 7, 2016

(54) SOLID-STATE QUANTUM MEMORY BASED ON A NUCLEAR SPIN COUPLED TO AN ELECTRONIC SPIN

(71) Applicants: Georg Kucsko, Cambridge, MA (US); Peter Maurer, Boston, MA (US); Liang Jiang, Pasadena, CA (US); Norman Yao, Cambridge, MA (US); Mikhail Lukin, Cambridge, MA (US)

(72) Inventors: Georg Kucsko, Cambridge, MA (US); Peter Maurer, Boston, MA (US); Liang Jiang, Pasadena, CA (US); Norman Yao, Cambridge, MA (US); Mikhail Lukin, Cambridge, MA (US)

(73) Assignee: PRESIDENT AND FELLOWS OF HARVARD COLLEGE, Cambridge, MA (US)

(*) Notice: Subject to any disclaimer, the term of this patent is extended or adjusted under 35 U.S.C. 154(b) by 169 days.

(21) Appl. No.: 14/365,161

(22) PCT Filed: Dec. 23, 2012

(86) PCT No.: PCT/US2012/071543
§ 371 (c)(1),
(2) Date: Jun. 13, 2014

(87) PCT Pub. No.: WO2013/096941
PCT Pub. Date: Jun. 27, 2013

(65) Prior Publication Data
US 2015/0009746 A1 Jan. 8, 2015

Related U.S. Application Data

(60) Provisional application No. 61/579,764, filed on Dec. 23, 2011.

(51) Int. Cl.
*G11C 13/00* (2006.01)
*G11C 11/16* (2006.01)
(Continued)

(52) U.S. Cl.
CPC .............. *G11C 11/161* (2013.01); *B82Y 10/00* (2013.01); *G06N 99/002* (2013.01); *G11C 13/04* (2013.01)

(58) Field of Classification Search
CPC ...................................................... G11C 13/00
USPC ......... 365/106, 129, 151, 152, 158, 161–163, 365/171, 192, 197, 200; 257/202, E29.071, 257/E29.168, E49.003; 438/73, 962; 977/708, 773, 774, 933
See application file for complete search history.

(56) References Cited

U.S. PATENT DOCUMENTS

2003/0031041 A1*  2/2003  Hannah ............... B82Y 10/00
                                             365/118
2004/0016943 A1*  1/2004  Hannah ............... B82Y 10/00
                                             257/200

(Continued)

OTHER PUBLICATIONS

Maurer Peter, "Long-lived solid-state room-temperature quantum memory", Bulletin of the American Physical Society; 42nd Annual Meeting of the APS Division of Atomic, Molecular, and Optical Physics, vol. 56, No. 5, Jun. 13-17, 2011, Atlanta, Georgia, USA Jun. 14, 2011, XP002692119, Retrieved from the Internet: URL:http://meeting.aps.org/Meeting/DAMOP11/Event/147178 [retrieved on Feb. 13, 2013] abstract.

(Continued)

*Primary Examiner* — Harry W Byrne
(74) *Attorney, Agent, or Firm* — Eilzabeth Kim Patent Law Offices LLC (57) ABSTRACT

A system comprising a solid state lattice containing an electronic spin coupled to a nuclear spin; an optical excitation configuration which is arranged to generate first optical radiation to excite the electronic spin to emit output optical radiation without decoupling the electronic and nuclear spins; wherein the optical excitation configuration is further arranged to generate second optical radiation of higher power than the first optical radiation to decouple the electronic spin from the nuclear spin thereby increasing coherence time of the nuclear spin; a first pulse source configured to generate radio frequency (RF) excitation pulse sequences to manipulate the nuclear spin and to dynamically decouple the nuclear spin from one or more spin impurities in the solid state lattice so as to further increase the coherence time of the nuclear spin; a second pulse source configured to generate microwave excitation pulse sequences to manipulate the electronic spin causing a change in intensity of the output optical radiation correlated with the electronic spin and with the nuclear spin via the coupling between the electronic spin and the nuclear spin; and a detector configured to detect the output optical radiation correlated with the electronic spin and the nuclear spin so as to detect a nuclear spin state of the nuclear spin.

29 Claims, 7 Drawing Sheets

(51) Int. Cl.
*G06N 99/00* (2010.01)
*G11C 13/04* (2006.01)
*B82Y 10/00* (2011.01)

(56) References Cited

U.S. PATENT DOCUMENTS

| | | | | |
|---|---|---|---|---|
| 2005/0018467 | A1* | 1/2005 | Naaman | H01J 21/10 365/145 |
| 2009/0164435 | A1* | 6/2009 | Routt | B82Y 10/00 |
| 2009/0237978 | A1* | 9/2009 | Lee | G11C 8/10 365/148 |
| 2009/0316471 | A1* | 12/2009 | Tsuchida | G11C 7/18 365/148 |
| 2010/0073995 | A1* | 3/2010 | Tran | B82Y 10/00 365/151 |

OTHER PUBLICATIONS

Dutt M V G, "Single Spins in Diamond for Quantum Networks and Magnetic Sensing", Proceedings of the SPIE—The International Society for Optical Engineering SPIE—The International Society for Optical Engineering USA; Conference Optical Data Storage 2010, May 23-26, 2010, Boulder, CO, USA, vol. 7730, pp. 773015/1-/13, XP002692842, ISSN: 0277-786X the whole document.

Fuchs G D et al, "A quantum memory intrinsic to single nitrogen-vacancy centres in diamond", Nature Physics Nature Publishing Group UK, vol. 7, No. 10, Oct. 2011, pp. 790-794, XP002692843, ISSN: 1745-2473 the whole document.

Jiang L et al, "Repetitive Readout of a Single Electronic Spin via Quantum Logic with Nuclear Spin Ancillae", Science American Association for the Advancement of Science USA, vol. 326, No. 5950, Oct. 9, 2009, pp. 267-272, XP002692120, ISSN: 0036-8075 the whole document.

Maurer P C et al: "Room-Temperature Quantum Bit Memory Exceeding One Second", Science American Association for the Advancement of Science USA, vol. 336, No. 6086, Jun. 8, 2012, pp. 1283-1286, XP002692121, ISSN: 0036-8075 the whole document.

"International Search Report" for PCT/US2012/071543, 3 pages, European Patent Office, Rijswijk, The Netherlands, Dec. 3, 2013.

* cited by examiner

SOLID-STATE QUANTUM MEMORY BASED ON A NUCLEAR SPIN COUPLED TO AN ELECTRONIC SPIN

CROSS-REFERENCE TO RELATED APPLICATIONS

This application is a 35 U.S.C. §371 National Phase Entry Application of International Application No. PCT/US2012/071543, filed Dec. 23, 2012, which designates the U.S., and which claims the benefit of priority under 35 U.S.C. §119(e) of U.S. Provisional Patent Application No. 61/579,764 (the "'764 provisional application"), filed Dec. 23, 2011 and entitled "Room Temperature Solid-State Quantum Bit With Second-Long Memory." The contents of each of these applications are incorporated herein by reference in their entireties.

BACKGROUND

Stable quantum bits, capable both of storing quantum information for macroscopic time scales and of integration inside small portable devices, are an essential building block for an array of potential applications. The realization of such stable quantum bits represents an outstanding challenge at the interface of quantum science and engineering. Such qubits are the essential building blocks for an array of potential applications in quantum communication and computation, many of which rely on the ability to maintain qubit coherence for extended periods of time.

Integrating such quantum-mechanical systems in compact mobile devices remains an outstanding experimental task. For a majority of quantum systems, lifetimes are limited to a tiny fraction of a second due to external perturbations and decoherence. Although trapped ions and atoms can exhibit coherence times as long as minutes, they typically require a complex infrastructure involving laser cooling and ultrahigh vacuum. Other systems, most notably ensembles of electronic and nuclear spins, have also achieved long coherence times in bulk electron spin resonance (ESR) and nuclear magnetic resonance (NMR) experiments.

For single spins or qubits, however, individual preparation, addressing, and high-fidelity measurement remain challenging, even at cryogenic temperatures, owing to their exceptional isolation.

SUMMARY

According to a first aspect of the present invention there is provided a system comprising:

a solid state lattice containing an electronic spin coupled to a nuclear spin;

an optical excitation configuration which is arranged to generate first optical radiation to excite the electronic spin to emit output optical radiation without decoupling the electronic and nuclear spins;

wherein the optical excitation configuration is further arranged to generate second optical radiation of higher power than the first optical radiation to decouple the electronic spin from the nuclear spin thereby increasing coherence time of the nuclear spin;

a first pulse source configured to generate radio frequency (RF) excitation pulse sequences to manipulate the nuclear spin and to dynamically decouple the nuclear spin from one or more spin impurities in the solid state lattice so as to further increase the coherence time of the nuclear spin;

a second pulse source configured to generate microwave excitation pulse sequences to manipulate the electronic spin causing a change in intensity of the output optical radiation correlated with the electronic spin and with the nuclear spin via the coupling between the electronic spin and the nuclear spin; and a detector configured to detect the output optical radiation correlated with the electronic spin and the nuclear spin so as to detect a nuclear spin state of the nuclear spin.

According to a second aspect of the present invention there is provided a method of manipulating a solid state lattice containing an electronic spin coupled to a nuclear spin, the method comprising:

applying first optical radiation and microwave excitation pulse sequences to manipulate the electronic spin into a magnetic state and thus initialize the nuclear spin via coupling between the electronic spin and the nuclear spin;

applying second optical radiation to the solid state lattice, said second optical radiation having a higher power than said first optical radiation to decouple the electronic spin from the nuclear spin;

applying radio frequency (RF) excitation pulse sequences to the solid state lattice to manipulate the nuclear spin and to dynamically decouple the nuclear spin from one or more spin impurities in the solid state lattice so as to increase the coherence time of the nuclear spin;

turning off the second optical radiation such that the electronic spin is re-coupled to the nuclear spin;

applying third optical radiation to the solid state lattice after turning off the second optical radiation, said third optical radiation being of lower power than said second optical radiation such that the electronic spin emits output optical radiation without decoupling of the electronic and nuclear spins;

applying microwave excitation pulse sequences to manipulate the electronic spin causing a change in intensity of the output optical radiation correlated with the electronic spin and with the nuclear spin via the coupling between the electronic spin and the nuclear spin; and detecting the output optical radiation correlated with the electronic spin and the nuclear spin so as to detect a nuclear spin state of the nuclear spin.

According to certain embodiments optical radiation is used to both initialize the nuclear spin and to read-out the nuclear spin via the electronic spin. During initialization and read-out the nuclear spin is coupled to the electronic spin. In the period between initialization and read-out of the nuclear spin, RF pulse sequences can be applied to address the nuclear spin and to decouple the nuclear spin from one or more spin impurities in the solid state lattice so as to increase the coherence time of the nuclear spin. Furthermore, in the period between initialization and read-out of the nuclear spin, high power optical radiation can be applied to the electronic spin to decouple the electronic spin from the nuclear spin so as to increase the coherence time of the nuclear spin. To read-out the nuclear spin via the electronic spin, the electronic spin may be re-coupled to the nuclear spin by turning off the high power optical radiation. A lower power optical radiation may then be used to address the electronic spin which emits optical radiation which is correlated with nuclear spin due to coupling between the nuclear spin and the electronic spin. This lower power radiation may be substantially identical to that used during initialization of the nuclear spin. Microwave excitation pulse sequences can be used during read-out to manipulate the electronic spin causing a change in intensity of the output optical radiation correlated with the electronic spin and with the nuclear spin via the coupling between the electronic spin and the nuclear spin.

According to certain embodiments, the optical excitation configuration may comprise separate optical sources for generating the lower power optical radiation and the higher power optical radiation. Alternatively, the optical excitation configuration may comprise a single optical source for generating the lower power optical radiation and the higher power optical radiation, the single optical source being configured such that power can be varied to switch between lower and higher power optical radiation.

The higher power optical radiation may be generated with a power which induces ionization and deionization of the electronic spin at a rate sufficient to decouple the electronic and nuclear spins. For example, the optical excitation configuration may be arranged to generate the optical radiation with a power no less than 10 mW, 20 mW, or 30 mW. In contrast, the lower power optical radiation should be of sufficient power to excite the electronic spin without decoupling the electronic spin from the nuclear spin in order to achieve initialization of the nuclear spin and read-out of the nuclear spin. As such, according to certain embodiments the lower power optical radiation may have a power in a range 0.1 mW to 10 mW, 0.5 mW to 5 mW, or 1 mW to 2 mW.

According to certain embodiments, the RF excitation pulse sequences may comprise a Mansfield-Rhim-Elleman-Vaughan (MREV)-8 pulse sequence. Alternatively, or additionally, the RF excitation pulse sequences may comprise at least one of: a Hahn-echo sequence; a CPMG sequence; and an XY pulse sequence. Such RF pulse sequences have been found to efficiently de-couple the nuclear spin from other nuclear spins present within a solid state lattice.

According to certain embodiments, the system may be configured to perform a single-shot detection of the nuclear spin state by repetitive readout of the electronic spin. For example, the nuclear spin may be measured via a CnNOTe logic gate and repetitive readout. This approach allows high fidelity initialization and read-out.

According to certain embodiments, a magnetic shield may be provided around the solid state lattice to shield the solid state lattice from external magnetic noise. The system may further comprise a static magnetic field generator which induces splitting of degenerate electronic and nuclear spin states in the solid state lattice. Such a controlled magnetic environment is advantageous for applications such as quantum information processing. In other applications, such as magnetic sensing, the spin state splitting is driven by an external field and the optical output is utilized to measure the external field. In this case no magnetic shielding and static field generator is required. Furthermore, in certain applications the earth's magnetic field may be utilized for the static magnetic field.

In order to ensure that the electronic and nuclear spins are coupled they should be located within close proximity to each other within the solid state lattice. For example, in certain embodiments a distance between the electronic spin the nuclear spin may be no more than 20 nm, 10 nm, 5 nm, 2 nm, or 1 nm. According to certain embodiments the solid state lattice is provided by a diamond material as this has been found to provide a stable magnetic environment in which to locate electronic and nuclear spins. Single crystal diamond material, and particularly single crystal chemical vapor deposited (CVD) synthetic diamond, is preferred as this material can be synthesized to very high levels of chemical purity with a low background level of spin defects. Furthermore, such material can be isotopically purified by reducing the concentration of naturally occurring $^{13}C$ thereby further reducing the background level of magnetic noise within the solid state lattice which adversely affects the stability of the electronic and nuclear spins of interest.

According to certain embodiments, the electronic spin comprises a nitrogen-vacancy defect ($NV^-$) located within a diamond lattice. The $NV^-$ defect has a number of advantageous properties for quantum applications including:
  (i) Its electron spin states can be coherently manipulated with high fidelity owing to an extremely long coherence time (which may be quantified and compared using the transverse relaxation time $T_2$);
  (ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and
  (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy, and imaging. Furthermore, it is a key ingredient towards using the $NV^-$ defects as qubits for long-distance quantum communications and scalable quantum computation. Such results make the $NV^-$ defect a competitive candidate for solid-state quantum information processing (QIP).

In light of the above, preferably the electronic spin of the present invention corresponds to an $NV^-$ spin defect. However, it is envisaged that the methodology described in the present specification could be applied to other electronic spin defects.

According to certain embodiments, the nuclear spin comprises a $^{13}C$ isotope within a diamond lattice. $^{13}C$ is naturally present in diamond material and the concentration can be controlled by, for example, using isotopically purified carbon source gases in a CVD diamond synthesis process. However, it is envisaged that other nuclear spins could be utilized. For example, $^{15}N$ may be introduced into a diamond crystal lattice and used as the nuclear spin. In one example the nuclear spin could be provided by a $^{15}N$ atom which forms part of an $NV^-$ spin defect such that both nuclear and electronic spins are provided within the $NV^-$ spin defect.

According to certain embodiments, the system is configured to operate with the solid state lattice at room temperature. In practice, one major achievement of this invention is the realization of long quantum coherence times at room temperature enabling practical quantum based devices without the requirement of cryogenic cooling. For example, embodiments can achieve a nuclear spin coherence time of at least 0.1 second, 0.2 second, 0.3 second, 0.5 second, 0.8 second, 1 second, 2 seconds, 10 seconds, 30 seconds, or 1 minute at room temperature. Furthermore, higher nuclear spin coherence times may be achieved by modifying the system further to include a temperature control system to maintain the solid state lattice at a desired operating temperature and/or by providing a frequency tracking system for tracking variations in transition frequencies of the electronic spin.

BRIEF DESCRIPTION OF THE DRAWINGS

The drawings disclose illustrative embodiments. They do not set forth all embodiments. Other embodiments may be used in addition or instead.

DETAILED DESCRIPTION

In the present application, room temperature solid state qubits are disclosed that are based on an individual nuclear spin in a solid, and that are capable of storing quantum information during macroscopic timescales.

In overview, a single nuclear spin (in a solid state lattice) is initialized into a well-defined state, using a nearby electronic spin that is weakly coupled to the nuclear spin, in some embodiments of the present application. In these embodiments, the electronic spin is also used to read out the nuclear spin in a single shot with high fidelity.

By a combination of laser illumination and radiofrequency (RF) decoupling pulse sequences, the nuclear coherence time and hence the qubit memory lifetime is extended by three orders of magnitude or more. In some embodiments, the nuclear coherence time can reach macroscopic timescales. For example, a coherence time of the nuclear spin may be at least 1 second, 2 seconds, 10 seconds, 30 seconds, or 1 minute.

The above-described combination of optical and RF excitation decouples the nuclear spin from both the nearby electronic spin and other nuclear spins, using optical dissipative decoupling as a robust and effective tool for protecting coherence in quantum information systems.

In some embodiments of the present application, the individual nuclear spin is a single $^{13}$C (I=½) nuclear spin in a diamond crystal, and the weakly coupled electronic spin is an individual nitrogen vacancy (NV) center in the diamond crystal.

Figure 1:
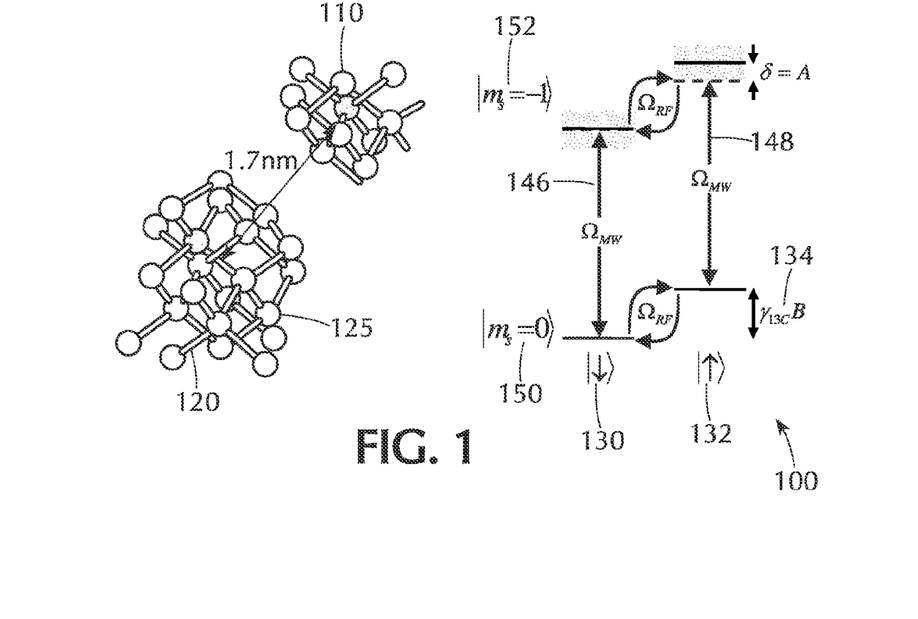
FIG. 1 schematically illustrates a room temperature solid-state qubit, consisting of an NV center and a proximal $^{13}$C spin, modeled as a four-level spin system.

FIG. 1 is a schematic diagram of a room temperature solid-state qubit 100, modeled as a four-level spin system. In the illustrated embodiment, the qubit 100 consists of an NV center 110 and a proximal $^{13}$C nuclear spin 120, in a solid state diamond lattice 125.

In some embodiments, an isotopically pure diamond sample may be used, which is grown by chemical vapor deposition from isotopically enriched carbon.

The diamond material comprises an NV$^-$ electronic spin defect located in close proximity to a $^{13}$C nuclear spin defect. The two defects should be within a few nanometers of each other such that the nuclear spin of the $^{13}$C is weakly coupled to the electronic spin of the NV$^-$. For example, the distance between the electronic spin and the nuclear spin may be no more than 20 nm, 10 nm, 5 nm, or 2 nm.

Ideally, both the NV$^-$ electronic spin defects and the $^{13}$C nuclear spin defect should have a high intrinsic coherence time. This can be achieved by providing very high purity diamond material both in terms of chemical impurities and isotopic impurities. As such the material is advantageously isotopically purified to reduce the "spin bath" within the diamond material, particular in terms of low $^{13}$C and low nitrogen concentrations. Of course, some level of $^{13}$C and nitrogen is required such that the material contains one or more NV$^-$ defects located within a few nanometers of a $^{13}$C nuclear spin defect.

For example, the $^{13}$C concentration may be no more than 1%, 0.5%, 0.1%, 0.05%, or 0.01% in at least a region surrounding the electronic spin and the nuclear spin (e.g. in at least a region defined by a cube of edge length 10 times the distance between the electronic and nuclear spins). However, in order to ensure that at least some NV$^-$:$^{13}$C pairs are formed then the $^{13}$C concentration may be no less than 0.0001%, 0.0005%, 0.001% in at least a region surrounding the electronic spin and the nuclear spin. For example, the diamond sample may comprise a $^{13}$C concentration of 0.01%. The coherence of the $^{13}$C may be extended by going to lower $^{13}$C concentrations although this may result in less NV$^-$:$^{13}$C pairs forming within the diamond lattice.

The substitutional nitrogen concentration may, for example, be no more than 300 ppb, 100 ppb, 50 ppb, 20 ppb, 10 ppb, 5 ppb, or 1 ppb in at least a region surrounding the electronic spin and the nuclear spin. However, in order to ensure that at least some NV$^-$:$^{13}$C pairs are formed then the substitutional nitrogen concentration may, for example, be no less than 0.0001 ppb, 0.001 ppb, 0.01 ppb, or 0.1 ppb in at least a region surrounding the electronic spin and the nuclear spin. In principle even lower concentrations of substitutional nitrogen can be provided so long as at least one closely spaced NV$^-$:$^{13}$C pair forms within the diamond lattice.

Concentrations of other impurities, particular magnetic impurities, should be minimized. Suitable singe crystal CVD synthetic diamond material is described in WO2010010352. Such single crystal CVD diamond material may have one or more of the following impurity characteristics:

(i) a total nitrogen concentration of 20 ppb or less, 10 ppb or less, or 5 ppb or less;

(ii) a concentration of NV centres of 10 ppb or less;

(iii) a total concentration of $^{13}$C of 0.9% or less;

(iv) a concentration of boron (and/or a concentration of uncompensated substitutional boron) of 100 ppb or less, 50 ppb or less, 20 ppb or less, 10 ppb or less, 5 ppb or less, 2 ppb or less, 1 ppb or less, 0.5 ppb or less, 0.2 ppb or less, or 0.1 ppb or less;

(v) a concentration of silicon of 100 ppb or less, 50 ppb or less, 20 ppb or less, 10 ppb or less, 5 ppb or less, 2 ppb or less, 1 ppb or less, 0.5 ppb or less, 0.2 ppb or less, 0.1 ppb or less, or 0.05 ppb or less;

(vi) a concentration of the silicon-vacancy (referred to as "SiV"), characterised by the intensity of the 737 nm photoluminescence (PL) line normalised against the intensity of the diamond Raman line at a shift of about 1332.5 cm$^{-1}$, both measured at a temperature of about 77 K, of 0.5 ppb or less, 0.2 ppb or less, 0.1 ppb or less, 0.05 ppb or less, 0.02 ppb or less, 0.01 ppb or less, or 0.005 ppb or less;

(vii) a concentration of intrinsic paramagnetic defects (i.e. defects which have a non-zero magnetic spin) of 1 ppm or less, 0.5 ppm or less, 0.2 ppm or less, 0.1 ppm or less, 0.05 ppm or less, 0.02 ppm or less, 0.01 ppm or less, 0.005 ppm or less, or 0.001 ppm or less;

(viii) a concentration of any single non-hydrogen impurity of 5 ppm or less, 1 ppm or less, or preferably 0.5 ppm or less;

(ix) a total impurity content excluding hydrogen and its isotopes of 10 ppm or less, 5 ppm or less, 2 ppm or less; and (x) a concentration of hydrogen impurities (specifically hydrogen and its isotopes) of $10^{18}$ cm$^{-3}$ or less, $10^{17}$ cm$^{-3}$ or less, $10^{16}$ cm$^{-3}$ or less, or $10^{15}$ cm$^{-3}$ or less.

The single crystal CVD diamond material may have one or more of the aforementioned impurity characteristics throughout a majority volume of 50%, 60%, 70%, 80%, 90%, 95%, or throughout the entire volume of the single crystal CVD diamond material. Alternatively, the single crystal CVD diamond material may comprise a plurality of layers having different quantities and/or distributions of impurities. In this case, one or more of the layers may have one or more of the aforementioned impurity characteristics.

As shown in FIG. 1, the nuclear spin sublevels 130 ($|\uparrow\rangle$) and 132 ($|\downarrow\rangle$) are split by a Zeeman shift 134 ($\gamma_{13C}B$), and addressed via RF radiation with Rabi frequency $\Omega_{RF}$. The electronic transitions 146 and 148, between the $m_s=0$ state 150 and the $m_s=-1$ state 152, can be simultaneously driven by a microwave field with relative detuning given by the hyperfine coupling strength 154 ($A_\parallel$).

In a sample having 99.99% purity, as described above, the optically detected ESR (Electron Spin Resonance) associated with a single NV center is only weakly perturbed by the $^{13}$C nuclear spins, resulting in long electronic spin coherence times. In this way, a Ramsey pulse sequence can be made use of, to detect a weakly coupled single nuclear spin.

In the illustrate embodiment, the $^{13}$C nuclear spin 120 is separated from the NV center electronic spin by 1.7 nm. In isotopically purified diamond, a typical distance between a $^{13}$C diamond and a proximal NV center spin may be about 1 to 2 nm. The coupling strength at such a distance is sufficiently large to allow for the preparation and measurement of the nuclear spin qubit with high fidelity. For a diamond sample having the above-described concentration (99.99%) of $^{13}$C nuclei, about 10% of all NV centers exhibit a coupled nuclear spin with a separation of this order.

The diamond sample may be magnetically shielded from external perturbations, and a static magnetic field applied along the NV symmetry axis. In some embodiments, the applied magnetic field strength is B=244.42±0.02 G.

The spin transitions 146 and 148 between the $|0\rangle \rightarrow |-1\rangle$ electronic spin states can be addressed via microwave radiation. The free-electron precession of an individual NV center can then be measured via a Ramsey sequence. The coupling strength, originating from a hyperfine interaction, corresponds to an electron-nuclear separation of roughly 1.7 nm.

Figure 2A:
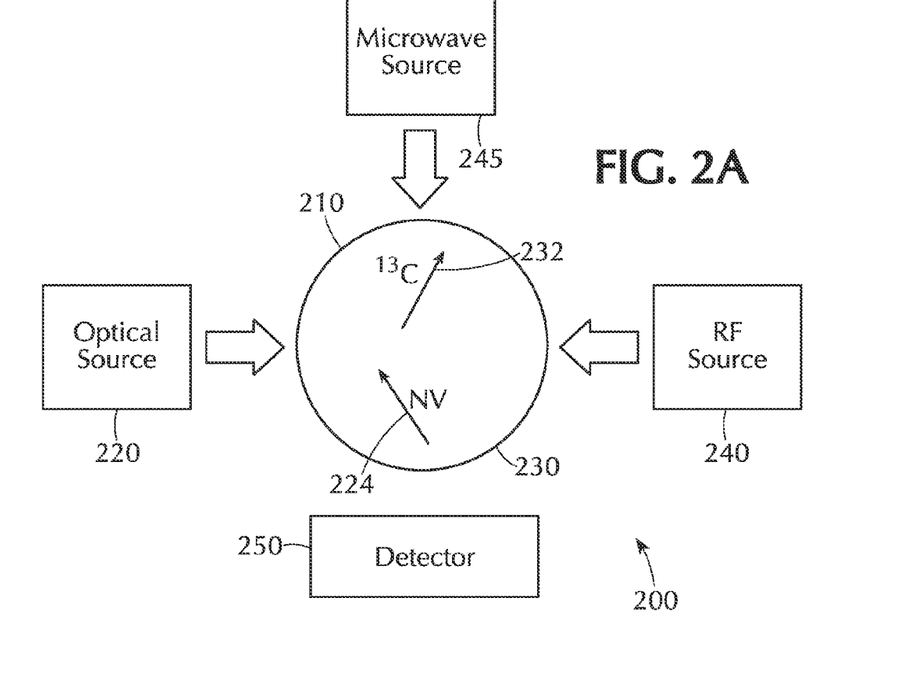
FIG. 2A is a schematic block diagram of a system that generates a solid state single qubit with extended coherence time, in accordance with one or more embodiments of the present application.

FIG. 2A is a schematic block diagram of one embodiment of a system 200 that generates a solid state qubit having a significantly extended coherence time, based on a single spin. The system 200 includes an optical source 220, such as a laser, that generates optical radiation to excite an electronic spin 224 in a solid state sample 230, so that a nuclear spin 232 in the sample 230 can be initialized and addressed by correlation with the electronic spin 224. The solid state sample 230 is a solid state lattice containing the electronic spin 224 and the weakly coupled nuclear spin 232.

The optical source 220 generates optical radiation that induces controlled optical dissipation that decouples the electronic spin 224 from the nuclear spin 232 during the initialization and addressing of the nuclear spin 232. In this way, coherence time of the nuclear spin is greatly increased.

The system 200 further includes an RF source 240 that generates RF excitation pulses. In particular, the RF source 240 generates dynamic decoupling RF pulse sequences that dynamically decouple the nuclear spin 232 from other nuclear impurities in the solid state lattice 230, so as to increase the coherence time of the nuclear spin 232 even further.

The system 200 may also include a microwave source 245 configured to generate microwave excitation pulse sequences to manipulate the electronic spin 224 causing a change in intensity of the output optical radiation correlated with the electronic spin 224 and with the nuclear spin 232 via the coupling between the electronic spin and the nuclear spin.

The system 200 further includes a detector 250 configured to detect output optical radiation correlated with the electronic spin, after optical excitation by the optical source and RF excitation by the RF source, so as to detect a nuclear spin state of the nuclear spin.

Figure 2B:
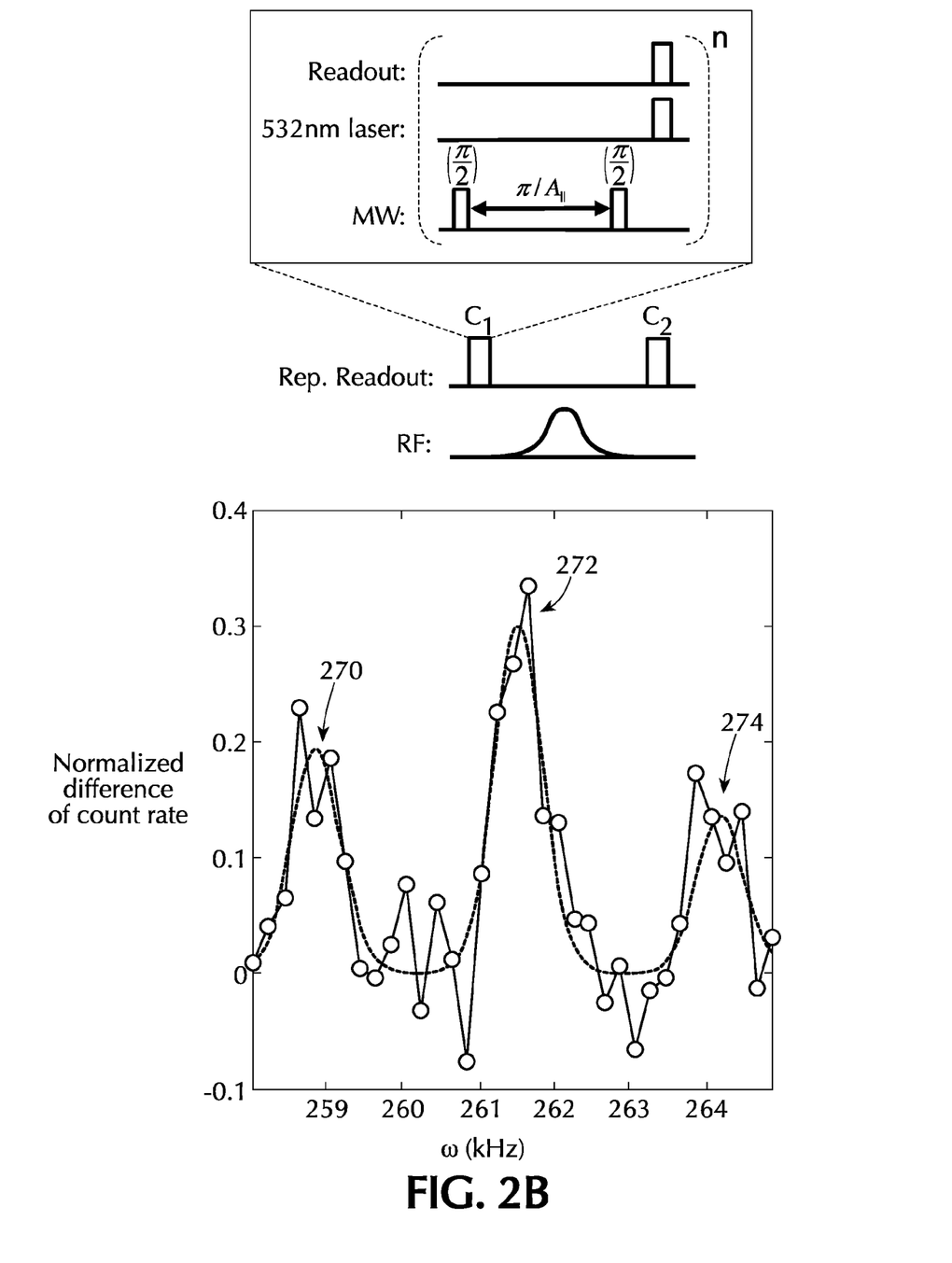
FIG. 2B illustrates three nuclear transitions of the $^{13}$C nuclear spin upon initialization and readout.

FIG. 2B illustrates three nuclear transitions 270, 272, and 274 of the $^{13}$C nuclear spin 232 (shown in FIG. 2A), upon initialization and readout. These transitions correspond to electronic spin states $m_s=0$, and ±1, respectively. The probability of an RF-induced nuclear spin-flip can be measured as a function of carrier frequency, after which the nuclear spin 232 can be prepared in either the $|\downarrow\rangle$ or $|\uparrow\rangle$ state by performing a projective measurement. In the illustrated embodiment, a 1.25-ms Gaussian shaped RF π-pulse was applied. After preparation of the nuclear spin 232 via projection, a second step of nuclear measurement allows the nuclear spin-flip to be determined.

As seen in FIG. 2B, this probability is characterized by three resonances 270, 272, and 274, located at $\omega/(2\pi)=258.86$, 261.52, and 264.18 kHz, corresponding to the NV electronic spin 224 being in the $m_s=1$, 0, and −1 spin states, respectively. The results indicate a projected hyperfine interaction $A_\parallel=(2\pi)$ (2.66±0.08) kHz.

An important facet of quantum control involves the ability to perform high-fidelity initialization and readout. In some embodiments of the present application, single shot detection of the nuclear spin state is achieved by repetitive readout.

Figure 3:
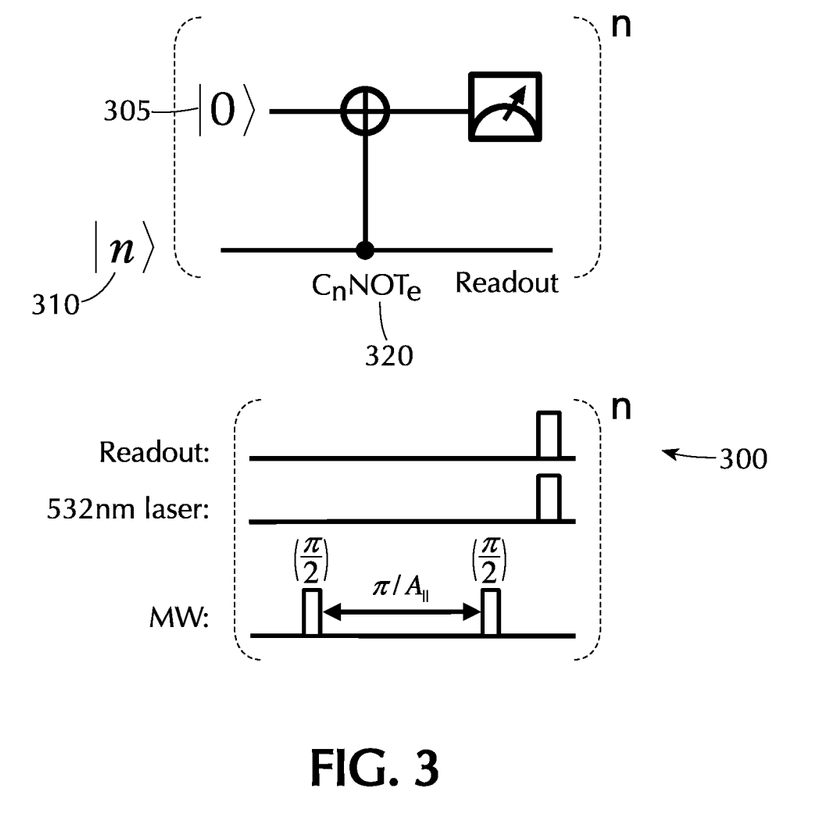
FIG. 3 illustrates a circuit diagram for repetitive readout of a single nuclear spin|n>.

FIG. 3 illustrates a circuit diagram 300 for repetitive readout of a single nuclear spin 310 ($|n\rangle$), in one or more embodiments of the present application. As seen in FIG. 3, the readout employs a plurality of $C_nNOT_e$ gates 320 consisting of an electronic spin Ramsey followed by readout and repolarization.

In the approach illustrated in FIG. 3, the electronic spin is first polarized into the $|0\rangle$ state 305. Next, a $C_nNOT_e$ logic gate 320 (electronic spin-flip conditioned on the nuclear spin) is performed, and the resulting state of the electronic spin is optically detected.

In some embodiments, this sequence is repeated multiple times to improve the readout fidelity. The required quantum logic is achieved via a Ramsey sequence on the electronic spin where the free precession time is chosen to be=/$A_\parallel$.

The signal resulting from the measured accumulated fluorescence has been shown to switch between two distinct values, which correspond to the two states of the spin-1/2 $^{13}$C nuclear spin. This time trace indicates that the nuclear spin preserves its orientation, on average, for about half a minute.

To achieve high-fidelity initialization of the nuclear spin, repetitive readout measurements can be post-selected that are below a threshold corresponding to 147 counts per 2.2 s and above a threshold corresponding to 195 counts per 2.2 s. This allows the nuclear spin state to be prepared with >97% fidelity.

In some embodiments, a second repetitive readout measurement is performed, after successful initialization via projection. This allows the readout count statistics to be extracted, dependent on the nuclear spin state. In the extracted statistics, the two distributions for the count rates of $|\uparrow\rangle$ and $|\downarrow\rangle$ are clearly resolved, and their medians match the high and low levels of the fluorescence trace. From the overlap between the two distributions, a projective readout fidelity of 91.9±2.5% is obtained for the above-described readout process.

The long spin-orientation lifetime, extracted from the fluorescence trace, implies that the $^{13}$C nuclear spin is an exceptionally robust degree of freedom. To quantify the nuclear depolarization rate, the $T_{1n}$ time may be measured as a function of laser intensity. While in the dark no decay was observed on a time scale of 200 s, consistent with predictions from a spin-fluctuator model, $T_{1n}$ dropped to 1.7±0.5 s when illuminated with a weak optical field, and increased linearly for higher laser intensities.

Figure 4A:
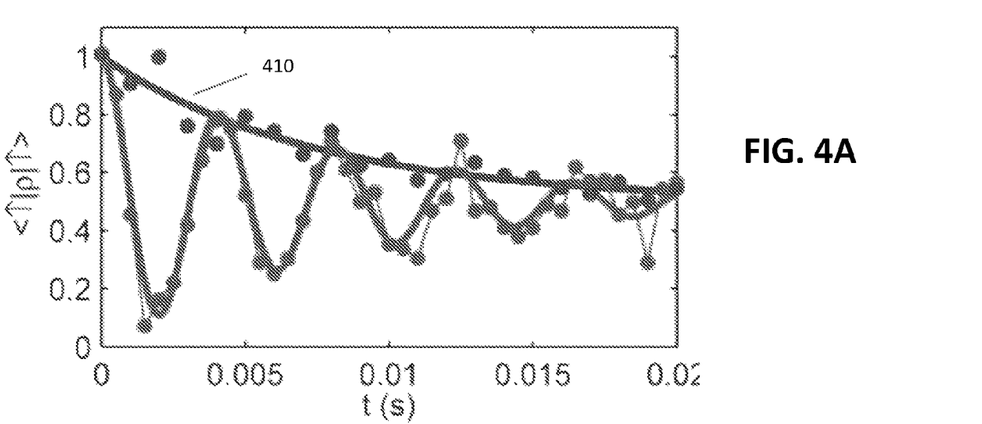
FIGS. 4A and 4B illustrate the enhancement of the nuclear coherence time of $^{13}$C using optical dissipation.
Figure 4B:
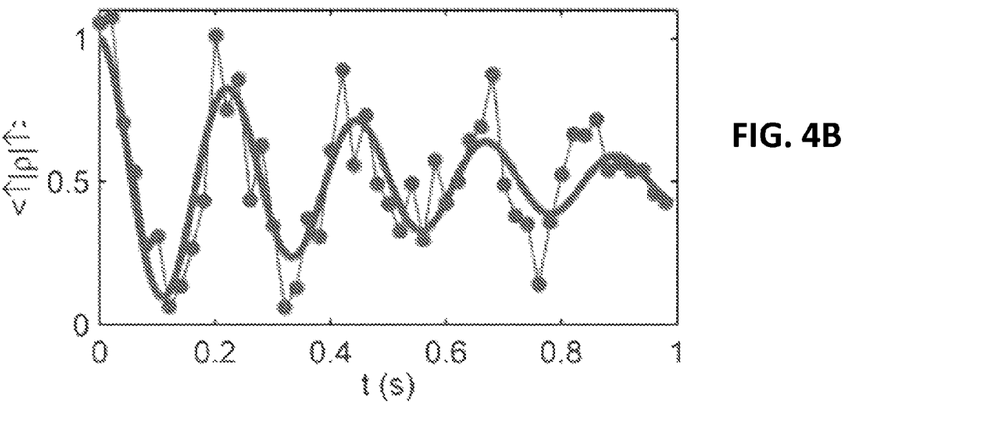

FIGS. 4A and 4B illustrate the enhancement of the nuclear coherence time of $^{13}$C using optical dissipation. To probe the qubit's coherence time, the nuclear spin is again prepared via a projective measurement, after which an NMR Ramsey pulse sequence is applied. The final state of the nuclear spin is detected via repetitive readout. The results demonstrate that in the dark, the nuclear coherence time $T_{2n}^*$ is limited to about 8.2±1.3 ms. The origin of this relatively fast dephasing time can be understood by noting its direct correspondence with the population lifetime of the electronic spin $T_{1e}$=7.5±0.8 ms, shown as curve 410 in FIG. 4A. Because the electron-nuclear coupling $A_\parallel$ exceeds $1/T_{1e}$, a single random flip of the electronic spin, from $|0\rangle$ to $|\pm1\rangle$, is sufficient to dephase the nuclear spin.

To extend the nuclear memory time, the electronic spin and the nuclear spin must be effectively decoupled, during the storage interval. In some embodiments, this is achieved by subjecting the electronic spin to controlled dissipation.

In one embodiment, the NV center is excited by a focused green laser beam, resulting in optical pumping of the NV center out of the magnetic states ($|\pm1\rangle$). In addition, the NV center also undergoes rapid ionization and deionization at a rate, proportional to the laser intensity. When these transition rates exceed the hyperfine coupling strength, the interaction between the nuclear and electronic spins is strongly suppressed, owing to a phenomenon analogous to motional averaging.

Figure 4C:
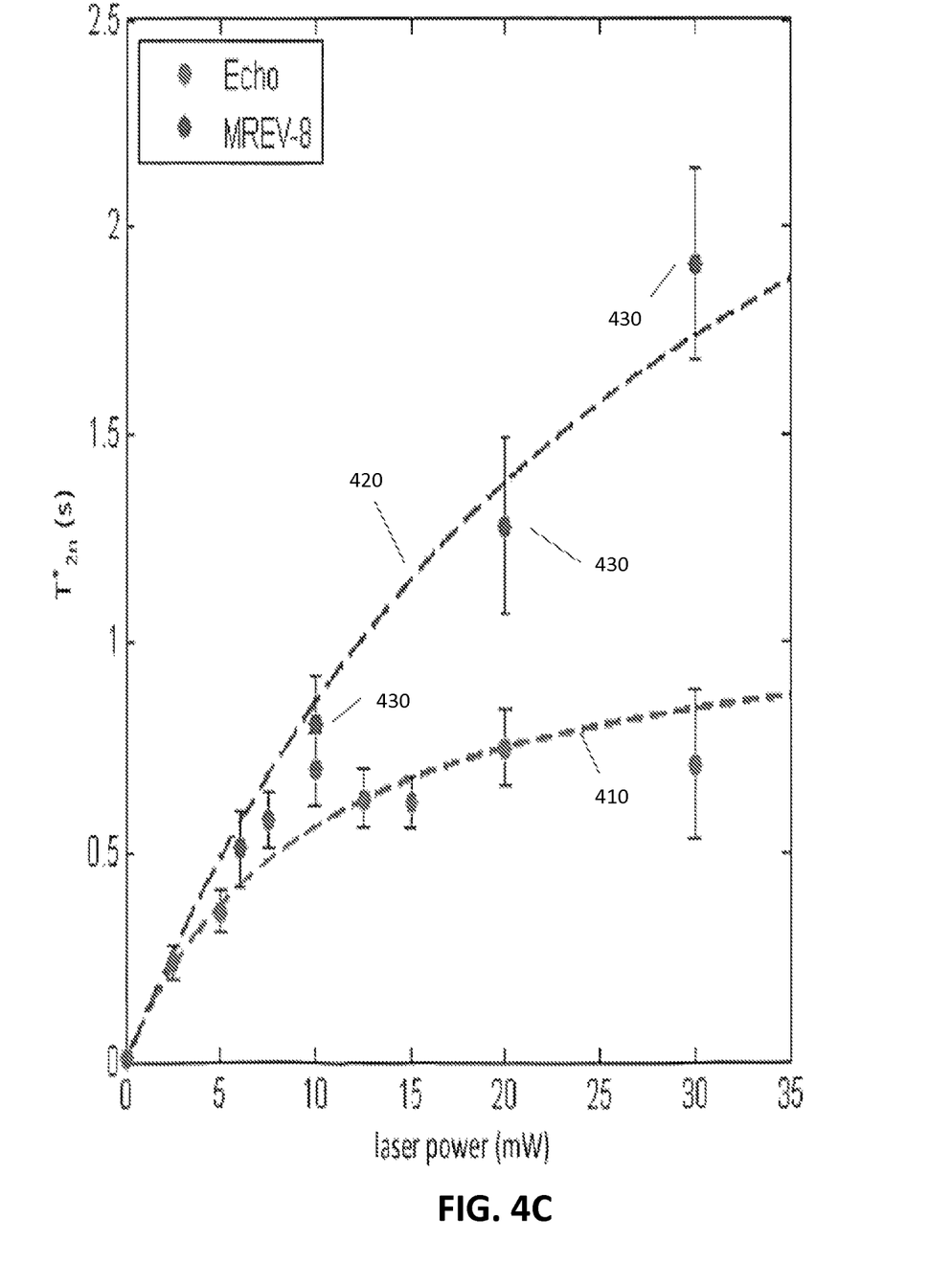
FIG. 4C is a plot of nuclear coherence as a function of laser power.

FIG. 4C is a plot of nuclear coherence as a function of laser power. FIG. 4C illustrates the dependence of $T_{2n}^*$ on green laser intensity, showing a linear increase for low intensities and saturates around 1 s.

FIG. 4C shows that the nuclear coherence time can be enhanced by simply applying green laser light, using the above-described decoupling scheme. As shown in FIG. 4C, 10 mW of green laser excitation yields an extended nuclear coherence time of $T_{2n}^*$=0.53±0.14 s. This is an improvement of $T_{2n}^*$ by almost two orders of magnitude as compared with measurements in the dark.

The observed limitation of coherence enhancement arises from dipole-dipole interactions of the nuclear qubit with other $^{13}$C nuclei in the environment. In the sample described above, this average dipole-dipole interaction is estimated to be ~1 Hz, consistent with the limit in the observed coherence time.

Figure 5:
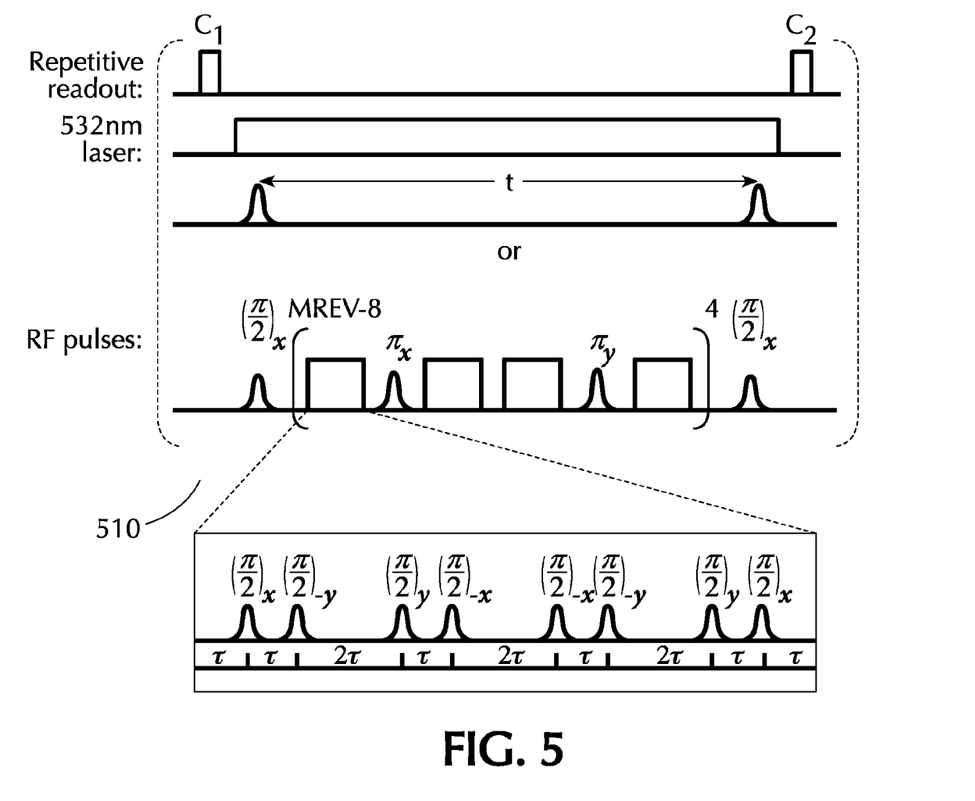
FIG. 5 illustrates an RF decoupling pulse sequence used in some embodiments of the present disclosure.

Further improvement of the nuclear coherence is achieved via a homonuclear radio frequency (RF) decoupling sequence. FIG. 5 illustrates an RF decoupling pulse sequence 510, used in some embodiments of the present application. The composite sequence illustrated in FIG. 5 is designed to both average out the internuclear dipole-dipole interactions (to first order) and to compensate for magnetic field drifts.

In the illustrated embodiment, a modified Mansfield-Rhim-Elleman-Vaughan (MREV) decoupling sequence is used to increase the nuclear coherence time. It consists of 16 MREV-8 pulse trains interwoven with eight phase-refocusing π-pulses. In the illustrated embodiment, each MREV-8 pulse sequence is achieved through π/2 rotations around four different axes. Applying this decoupling sequence in combination with green excitation can further extend the coherence time to beyond 1 sec, as illustrated by the data points 430 in FIG. 4C.

It should be understood that in other embodiments, different pulse sequences may be used. By way of example, one or more of the following RF pulse sequences, or some combination thereof, may be used, in addition to or in lieu of the above-described MREV-8 pulse sequence: a Hahn-Echo pulse sequence; a CPMG (Can Purcell Meiboom Gill) sequence; and an XY pulse sequence.

A quantitative understanding of the coherence extension under green illumination may be gained by considering depolarization and dephasing of the nuclear spin due to optical illumination and interaction with the nuclear spin environment. Excitation with 532 nm ionizes, as well as deionizes, the NV center with a rate proportional to the laser intensity. Adding up the peak probabilities for the nuclear RF transitions reveals a total transition probability of 63±5%. This is consistent with recent observations in which, under strong green illumination, the NV center is found to spend 30% of its time in an ionized state.

In this state, RF-induced nuclear transitions are suppressed, because the depolarization rate of the electronic spin is much faster than the nuclear Rabi frequency. Because the hyperfine interaction is much smaller than the electronic Zeemann splitting, flip-flop between the electronic and nuclear spins can be neglected. However, in the presence of an off-axis dipolar hyperfine field $A_\perp$, nuclear depolarization still occurs at a rate $1=T_{1n} \sim A_\perp^2/[(\gamma_{13C}B/2)^2+\gamma^2]$.

Because $T_{1n}$ limits readout, careful alignment of the external magnetic field, that is choosing $A_\perp \rightarrow 0$, and enhanced collection efficiency would allow for readout fidelities greater than 99%.

For ionization rates, much larger than the hyperfine interaction, the dephasing rate depends on the parallel component of the dipole field, $1/T_{2n}^* = \Gamma_{opt}+\Gamma_{dd}$, where $\Gamma_{dd}$ is the spin-bath—induced dephasing rate and $\Gamma_{opt} \sim A_\parallel^2/\gamma$ is the optically induced decoherence. The curve 420 in FIG. 4C demonstrates that the above-described model is in good agreement with experimental data.

The application of the decoupling sequence also allows nuclear-nuclear dephasing. One of the main imperfections in this decoupling procedure originates from a finite RF detuning. The upper dashed curve 420 in FIG. 4C is obtained by accounting for this imperfection, and demonstrates excellent agreement with experimental data. Furthermore, the above model indicates that the coherence time increases almost linearly as a function of applied laser intensity, suggesting a large potential for improvement.

Figure 6:
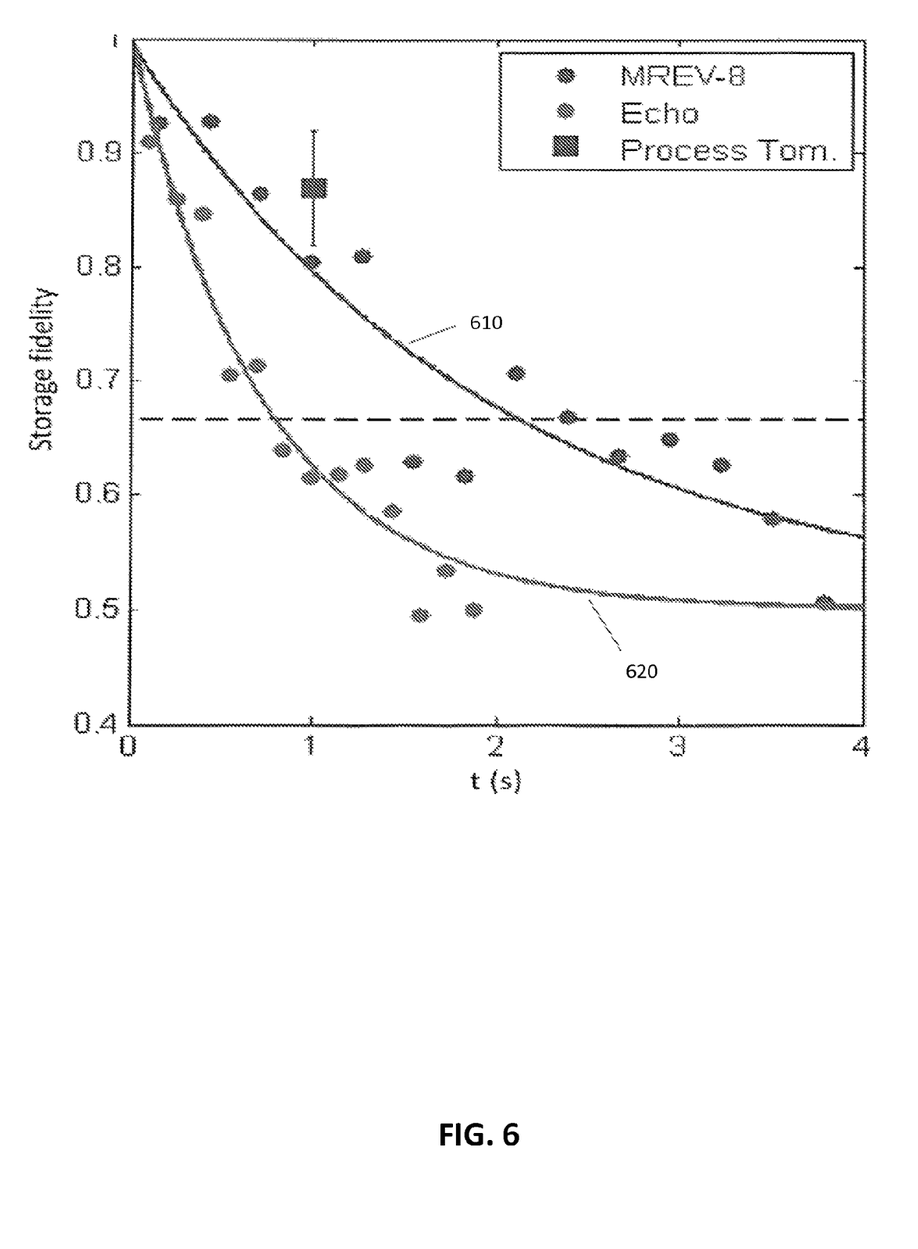
FIG. 6 is a plot of nuclear memory fidelity as a function of time.

FIG. 6 is a plot as a function of time of nuclear memory fidelity (i.e. storage fidelity) as a function of time. In some embodiments, the average fidelity is determined by preparing and measuring the qubit along three orthogonal directions. In the illustrated embodiment, the qubit was measured along the following directions:

$$|x\rangle = \frac{1}{\sqrt{2}}(|\downarrow\rangle + |\uparrow\rangle), |y\rangle = \frac{1}{\sqrt{2}}(|\downarrow\rangle + i|\uparrow\rangle), \text{ and } |z\rangle = |\downarrow\rangle.$$

The average fidelity F is then extracted from the observed contrast of the signal. FIG. 6 shows a plot of the average fidelity F for two cases, namely with homonuclear decoupling (curve 610) and without homonuclear decoupling (curve 620). FIG. 6 shows that even for memory times up to 2.11±0.3 s, the fidelity remains above the classical limit of ⅔.

The system as described herein may be configured to operate with the solid state lattice at room temperature. In the above example, the use of higher laser powers to further increase nuclear spin coherence is limited by heating of the diamond sample which causes drifts in the ESR transition. By reducing laser heating, carefully tracking transition frequencies, and further reducing $^{13}C$ concentrations, coherence times in excess of 1 minute will be achievable. This can be achieved by modifying the system to further include a temperature control system to maintain the solid state lattice at a desired operating temperature. For example, a larger diamond sample may be provided to spread heat away from the point of laser contact. More efficient thermal mounting of the diamond sample using bonding materials with high thermal conductivity reducing thermal barrier resistance will also aid heat dissipation. Further cooling may be provided using suitable cooling fluids and/or fan systems such that the temperature of the solid state lattice is maintained at a desired operating temperature (at least within an acceptable operating temperature range). Such measures will allow higher power lasers to be utilized leading to further increases in coherence time. In addition, any drift in ESR transitions can also be compensated by actively tracking the transition frequency which will also allow higher power lasers to be used thus leading to further increases in coherence time. The ultimate limit of coherence times will be set by the phonon-induced nuclear depolarization, yielding $T_{1n}^{max}$~36 hours.

In summary, methods and systems have been described relating to long-lived memory qubits, such as individual nuclear spins in isotopically pure diamond.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure. While certain embodiments have been described, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A system comprising:
   a solid state lattice containing an electronic spin coupled to a nuclear spin;
   an optical excitation configuration which is arranged to generate first optical radiation to excite the electronic spin to emit output optical radiation without decoupling the electronic and nuclear spins;
   wherein the optical excitation configuration is further arranged to generate second optical radiation of higher power than the first optical radiation to decouple the electronic spin from the nuclear spin thereby increasing coherence time of the nuclear spin;
   a first pulse source configured to generate radio frequency (RF) excitation pulse sequences to manipulate the nuclear spin;
   a second pulse source configured to generate microwave excitation pulse sequences to manipulate the electronic spin causing a change in intensity of the output optical radiation correlated with the electronic spin and with the nuclear spin via the coupling between the electronic spin and the nuclear spin; and
   a detector configured to detect the output optical radiation correlated with the electronic spin and the nuclear spin so as to detect a nuclear spin state of the nuclear spin.

2. The system of claim 1, wherein the first pulse source is further configured to generate the RF excitation pulse sequences to dynamically decouple the nuclear spin from one or more spin impurities in the solid state lattice so as to further increase the coherence time of the nuclear spin.

3. The system of claim 1, wherein the RF excitation pulse sequences comprise a Mansfield-Rhim-Elleman-Vaughan (MREV)-8 pulse sequence.

4. The system of claim 1, wherein the RF excitation pulse sequences comprise at least one of: a Hahn-echo sequence; a CPMG sequence; and an XY pulse sequence.

5. The system of claim 1, wherein the system is further configured to perform a single-shot detection of the nuclear spin state by repetitive readout of the electronic spin.

6. The system of claim 5, wherein a $C_nNOT_e$ logic gate is used for performing the readout.

7. The system of claim 1, further comprising a magnetic shield around the solid state lattice to shield the solid state lattice from external magnetic noise.

8. The system of claim 1, further comprising a static magnetic field generator which induces splitting of degenerate electronic and nuclear spin states in the solid state lattice.

9. The system of claim 1, wherein a distance between the electronic spin and the nuclear spin is no more than 20 nm, 10 nm, 5 nm, 2 nm, or 1 nm.

10. The system of claim 1, wherein the solid state lattice comprises diamond and the electronic spin comprises an $NV^-$ center in the diamond.

11. The system of claim 10, wherein the nuclear spin comprises a $^{13}C$ isotope within the diamond.

12. The system of claim 10, wherein the diamond comprises a $^{13}C$ concentration of no more than 1%, 0.5%, 0.1%, 0.05%, or 0.01% in at least a region surrounding the electronic spin and the nuclear spin.

13. The system of claim 12, wherein said $^{13}C$ concentration is no less than 0.0001%, 0.0005%, or 0.001% in at least a region surrounding the electronic spin and the nuclear spin.

14. The system of claim 10, wherein the diamond comprises a substitutional nitrogen concentration of no more than 100 ppb, 50 ppb, 20 ppb, 10 ppb, 5 ppb, or 1 ppb in at least a region surrounding the electronic spin and the nuclear spin.

15. The system of claim 14, wherein the substitutional nitrogen concentration is no less than 0.0001 ppb, 0.001 ppb, 0.01 ppb, or 0.1 ppb in at least a region surrounding the electronic spin and the nuclear spin.

16. The system of claim 1, wherein the system is configured to operate with the solid state lattice at room temperature.

17. The system of claim 1, wherein the system further comprises a temperature control system to maintain the solid state lattice at a desired operating temperature.

18. The system of claim 1, wherein the system further comprises a frequency tracking system for tracking variations in transition frequencies of the electronic spin.

19. The system of claim 1, wherein a coherence time of the nuclear spin is at least 0.1 s, 0.2 s, 0.3 s 0.5 s, 0.8 s, 1 s, 2 s, 10 s, 30 s, or 1 minute.

20. The system of claim 1, wherein the optical excitation configuration comprises a first optical source for generating the first optical radiation and a second optical source for generating the second optical radiation.

21. The system of claim 1, wherein the optical excitation configuration comprises a single optical source for generating the first and second optical radiation, said optical source being configured such that power can be varied to switch between the first and second optical radiation.

22. The system of claim 1, wherein the optical excitation configuration is arranged to generate the second optical radiation with a power which induces ionization and deionization of the electronic spin at a rate sufficient to decouple the electronic and nuclear spins.

23. The system of claim 1, wherein the optical excitation configuration is arranged to generate the second optical radiation with a power no less than 10 mW, 20 mW, or 30 mW.

24. The system of claim 1, wherein the optical excitation configuration is arranged to generate the first optical radiation with a power in a range of 0.1 mW to 10 mW, 0.5 mW to 5 mW, or 1 mW to 2 mW.

25. The system of claim 1, wherein the optical excitation configuration is arranged to generate the second optical radiation at a wavelength of 532 nm.

26. The system of claim 1, wherein the optical excitation configuration is arranged to generate the second optical radiation at a wavelength of less than 637 nm.

27. The system of claim 10, wherein the nuclear spin comprises a Nitrogen within the diamond.

28. A method of manipulating a solid state lattice containing an electronic spin coupled to a nuclear spin, the method comprising:
    applying first optical radiation and microwave excitation pulse sequences to manipulate the electronic spin into a magnetic state and thus initialize the nuclear spin via coupling between the electronic spin and the nuclear spin;
    applying second optical radiation to the solid state lattice, said second optical radiation having a higher power than said first optical radiation to decouple the electronic spin from the nuclear spin;
    applying radio frequency (RF) excitation pulse sequences to the solid state lattice to manipulate the nuclear spin and to dynamically decouple the nuclear spin from one or more spin impurities in the solid state lattice so as to increase the coherence time of the nuclear spin;
    turning off the second optical radiation such that the electronic spin is re-coupled to the nuclear spin;
    applying third optical radiation to the solid state lattice after turning off the second optical radiation, said third optical radiation being of lower power than said second optical radiation such that the electronic spin emits output optical radiation without decoupling of the electronic and nuclear spins;
    applying microwave excitation pulse sequences to manipulate the electronic spin causing a change in intensity of the output optical radiation correlated with the electronic spin and with the nuclear spin via the coupling between the electronic spin and the nuclear spin; and
    detecting the output optical radiation correlated with the electronic spin and the nuclear spin so as to detect a nuclear spin state of the nuclear spin.

29. A method according to claim 28, wherein the first and third optical radiation have the same power and frequency.

* * * * *